(12) United States Patent
Wu

(10) Patent No.: US 8,417,867 B2
(45) Date of Patent: Apr. 9, 2013

(54) MULTICHIP MODULE FOR COMMUNICATIONS

(75) Inventor: Ephrem C. Wu, San Mateo, CA (US)

(73) Assignee: Xilinx, Inc., San Jose, CA (US)

( * ) Notice: Subject to any disclaimer, the term of this patent is extended or adjusted under 35 U.S.C. 154(b) by 281 days.

(21) Appl. No.: 12/948,000

(22) Filed: Nov. 17, 2010

(65) Prior Publication Data

US 2012/0124257 A1    May 17, 2012

(51) Int. Cl.
*G06F 13/42* (2006.01)
(52) U.S. Cl. ........... 710/317; 710/106; 710/315; 326/38
(58) Field of Classification Search ................... 713/320; 710/106
See application file for complete search history.

(56) References Cited

U.S. PATENT DOCUMENTS

| | | | |
|---|---|---|---|
| 5,530,813 A * | 6/1996 | Paulsen et al. ............... | 710/317 |
| 6,060,903 A | 5/2000 | Rangasayee et al. | |
| 6,181,159 B1 | 1/2001 | Rangasayee | |
| 6,404,225 B1 | 6/2002 | Rangasayee | |
| 6,721,313 B1 * | 4/2004 | Van Duyne ................... | 370/386 |
| 6,759,869 B1 | 7/2004 | Young et al. | |
| 7,057,413 B1 | 6/2006 | Young et al. | |
| 7,062,586 B2 * | 6/2006 | Donlin et al. ................ | 710/305 |
| 7,149,996 B1 | 12/2006 | Lysaght et al. | |
| 7,239,669 B2 * | 7/2007 | Cummings et al. ........... | 375/295 |
| 7,310,459 B1 | 12/2007 | Rahman | |
| 7,673,087 B1 * | 3/2010 | Ansari et al. ................. | 710/241 |
| 7,707,304 B1 * | 4/2010 | Lolayekar et al. ............ | 709/233 |
| 7,730,244 B1 * | 6/2010 | Ansari et al. ................. | 710/107 |
| 7,864,758 B1 * | 1/2011 | Lolayekar et al. ............ | 370/389 |
| 7,912,997 B1 * | 3/2011 | Murray ......................... | 710/22 |
| 8,006,021 B1 * | 8/2011 | Li et al. ........................ | 710/306 |
| 8,250,280 B1 * | 8/2012 | Rohana et al. ............... | 710/311 |
| 2003/0079019 A1 * | 4/2003 | Lolayekar et al. ............ | 709/226 |
| 2006/0174048 A1 * | 8/2006 | Ohara et al. .................. | 710/305 |
| 2006/0237835 A1 * | 10/2006 | Fujita et al. .................. | 257/691 |
| 2011/0225334 A1 * | 9/2011 | Byrne et al. .................. | 710/110 |

FOREIGN PATENT DOCUMENTS

WO    WO 03027877 A2 *    4/2003
WO    WO 2003/075477 A3    9/2003

OTHER PUBLICATIONS

Agere Systems Inc., *ORCA ORT8850 Field Programmable System Chip (FPSC) Eight-Channel x 850 Mbits/s Backplane Transceiver*, Aug. 2001, pp. 1-54, Agere Systems Inc., Allentown, Pennsylvania, USA.

(Continued)

*Primary Examiner* — Ryan Stiglic
(74) *Attorney, Agent, or Firm* — W. Eric Webostad; LeRoy D. Maunu

(57) ABSTRACT

An embodiment of a multichip module is disclosed. For this embodiment of the multichip module, a transceiver die has transceivers. A crossbar switch die has at least one crossbar switch. A protocol logic blocks die has protocol logic blocks. The transceiver die, the crossbar switch die, and the protocol logic blocks die are all coupled to an interposer. The interposer interconnects the transceivers and the protocol logic blocks to one another and interconnects the protocol logic blocks and the at least one crossbar switch to one another.

18 Claims, 16 Drawing Sheets

OTHER PUBLICATIONS

Knickerbocker, J. U. et al., "Development of next-generation system-on-package (SOP) technology based on silicon carriers with fine-pitch chip interconnection," *IBM J. Res. & Dev.*, Jul. 2005, pp. 725-753, vol. 49, No. 4/5, IEEE, Piscataway, New Jersey, USA.

Martin, Grant et al., *Winning the SoC revolution: experiences in real design*, Jun. 30, 2003, pp. 292-293, paragraph 6,2, Springer Science + Business Media Inc., New York, New York, USA.

Maurelli, Alfonso et al., "SoC and SiP, the Yin and Yang of the Tao for the New Electronic Era," *Proceedings of the IEEE*, Jan. 2009, pp. 9-17, vol. 97, No. 1, IEEE, Piscataway, New Jersey, USA.

Metzger, Andre G. et al., "A 10-Gb/s High-Isolation, 16×16 Crosspoint Switch Implemented with AlGaAs/GaAs HBT's," *IEEE Journal of Solid-State Circuits*, Apr. 2000, pp. 593-600, vol. 35, No. 4, IEEE, Piscataway, New Jersey, USA.

Rojas-Cessa, Roberto et al., "CIXOB-k: Combined Input-Crosspoint-Output Buffered Packet Switch," *Proc. of the IEEE 2001 Global Telecommunications Conference*, Nov. 25, 2001, pp. 2654-2660, vol. 4, IEEE, Piscataway, New Jersey, USA.

\* cited by examiner

MULTICHIP MODULE FOR COMMUNICATIONS

FIELD OF THE INVENTION

An embodiment of the invention relates to integrated circuit devices ("ICs"). More particularly, an embodiment of the invention relates to a multichip module for communications.

BACKGROUND

High-throughput switch fabric integrated circuits conventionally are formed of a single monolithic integrated circuit, which tends to be a substantially large integrated circuit. Therefore, semiconductor process complexity and/or costs associated with manufacturing such integrated circuits for a variety of application contexts are relatively high. Furthermore, if a protocol is sufficiently changed, such large monolithic integrated circuits may have to be replaced, adding to the costs. Hence, it is desirable to provide a high-throughput switch fabric that reduces such costs.

SUMMARY

One or more embodiments generally relate to a multichip module for communications.

An embodiment relates generally to a multichip module. In such an embodiment, a transceiver die has transceivers. A crossbar switch die has at least one crossbar switch. A protocol logic blocks die has protocol logic blocks. The transceiver die, the crossbar switch die, and the protocol logic blocks die are all coupled to an interposer. The interposer interconnects the transceivers and the protocol logic blocks to one another and interconnects the protocol logic blocks and the at least one crossbar switch to one another.

Another embodiment relates generally to a method for communication. In such an embodiment, a packet is received by a transceiver die of a multichip module. The packet is provided from the transceiver die to a protocol logic blocks die of the multichip module via an interposer. The interposer interconnects the transceiver die and the protocol logic blocks die to one another. The packet is provided from the protocol logic blocks die to a crossbar switch die of the multichip module via the interposer. The interposer interconnects the protocol logic blocks die and the crossbar switch die to one another.

Yet another embodiment relates generally to a multichip module. In such an embodiment, at least one communication die, at least one protocol logic blocks die, and a crossbar switch die are mounted on an interposer. The interposer interconnects the at least one communication die, the at least one protocol logic blocks die, and the crossbar switch die for communication of information into and out of the multichip module via at least one of each of three types of die represented by the at least one communication die, the at least one protocol logic blocks die, and the crossbar switch die.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
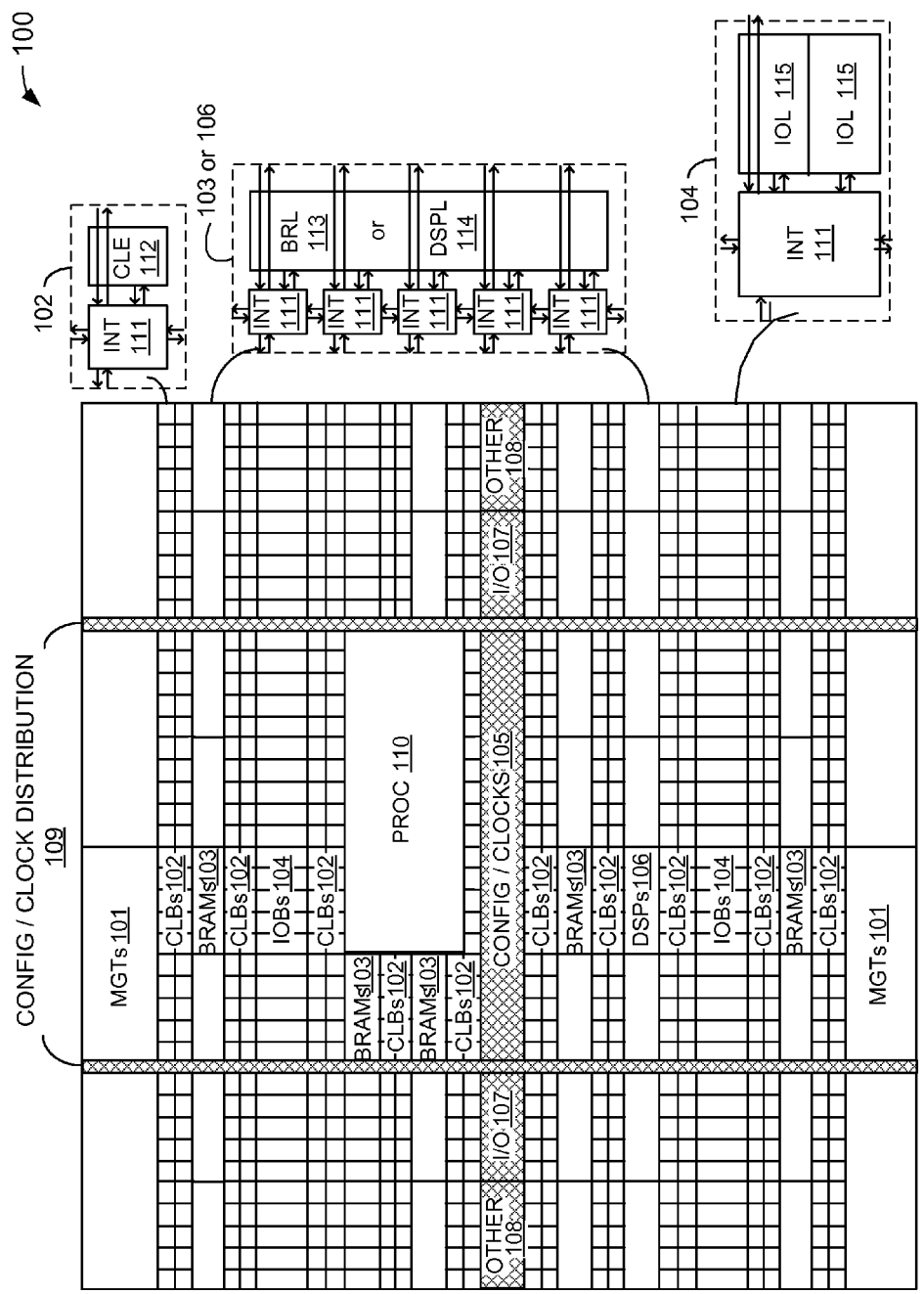
FIG. 1 is a simplified block diagram depicting an exemplary embodiment of a columnar Field Programmable Gate Array ("FPGA") architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different. Furthermore, single instances of objects may be used to indicate multiple instances thereof for purposes of clarity.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

A high-throughput switch fabric may be a monolithic integrated circuit having one or more crossbar switches ("XBARs"). Such monolithic integrated circuits may have multiple repeating protocol elements ("PEs"), where each PE may consist of one or more high-speed serial transceivers ("HSTs") and one protocol logic block ("PLB"). Such a monolithic integrated circuit may be an Application Specific Integrated Circuit ("ASIC") or an Application Specific Standard Product ("ASSP") with hardened PEs.

In contrast, described below in additional detail is a scalable system-in-package multiple-die device, such as a multi-chip module ("MCM"), for providing a high-throughput, field programmable network switch. Such a scalable system-in-package multiple die device may include multiple high-speed serial transceivers. Furthermore, such a scalable system-in-package multiple-die device may be used to provide a multi-protocol network switch.

Figure 2:
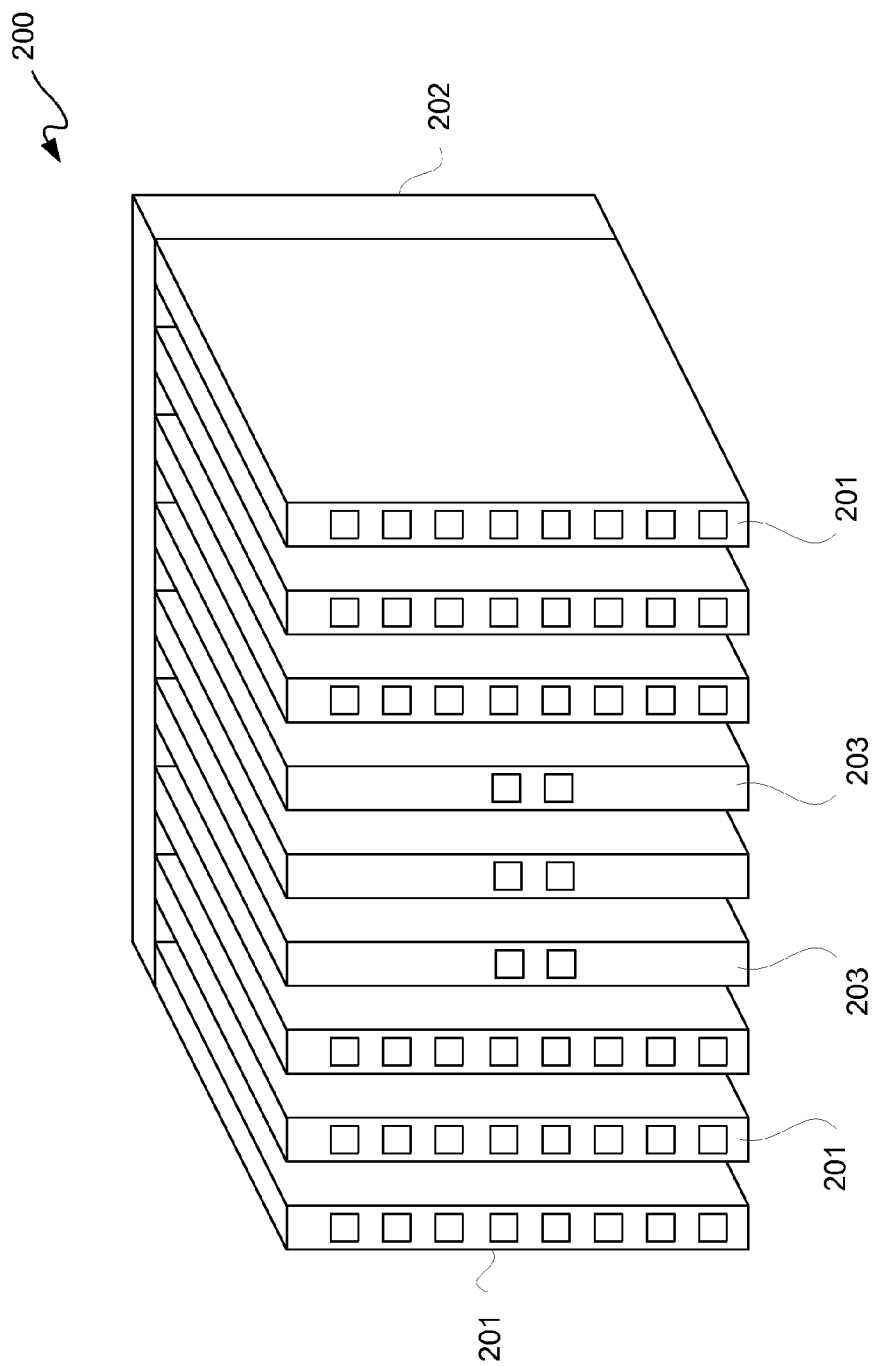
FIG. 2 is a perspective view block diagram depicting an exemplary embodiment of a network switch.

FIG. 2 is a perspective view block diagram depicting an exemplary embodiment of a network switch 200. Network switch 200 may include one or more line cards 201, a backplane 202, and one or more switch cards 203. Such a network switch 200 may further include a chassis, a heat transfer device, or other components, which are not shown or described herein for purposes of clarity and not limitation.

Figure 3:
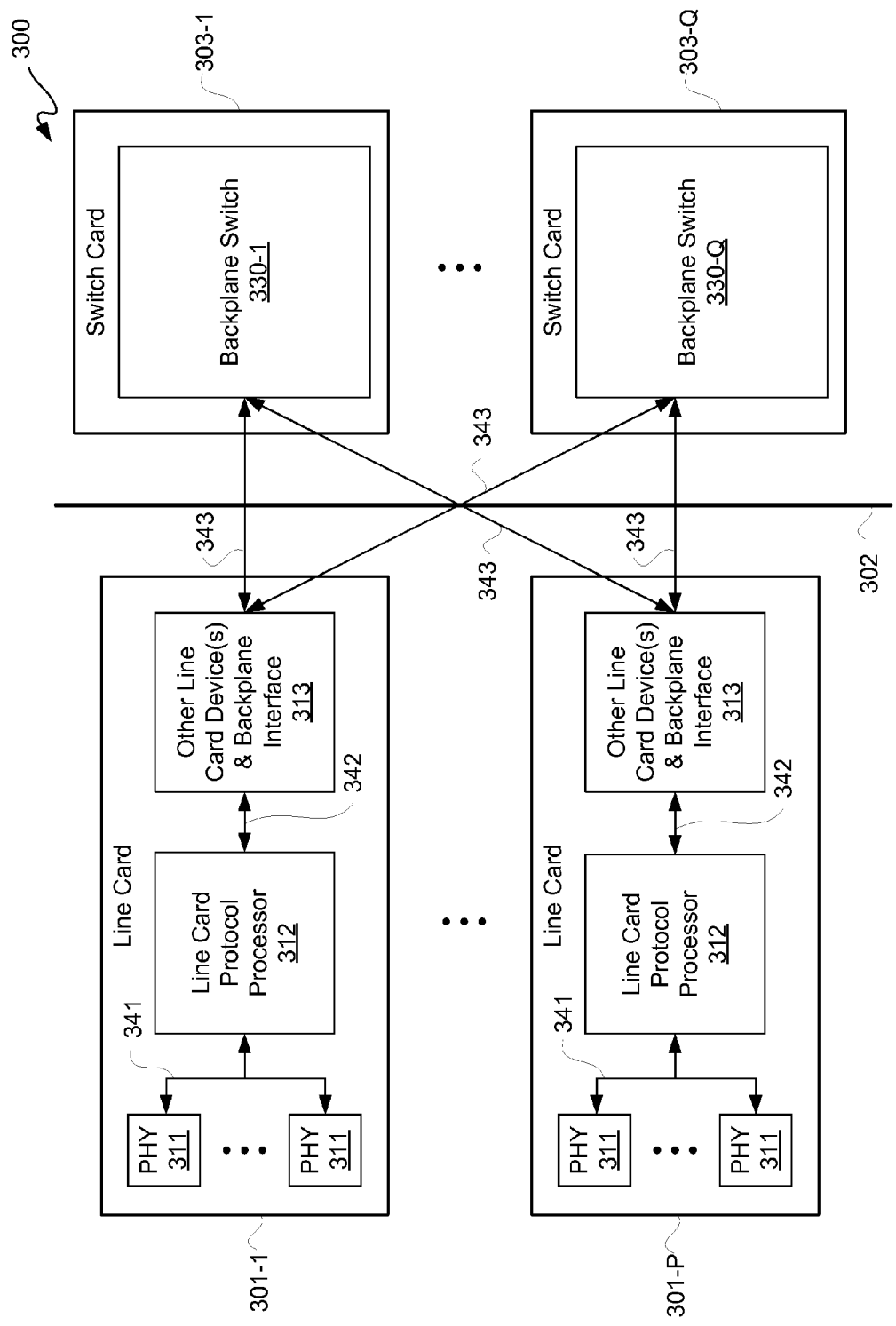
FIG. 3 is a block diagram depicting an exemplary embodiment of a switching system.

FIG. 3 is a block diagram depicting an exemplary embodiment of a switching system 300. Switching system 300 may be implemented as a network switch, such as network switch 200 of FIG. 2, for example. Switching system 300 is a chassis-based switching system; however, other types of switching systems may be used in accordance with description herein.

Switching system 300 includes backplane 302 and one or more line cards, such as line cards 301-1 through 301-P ("301") for P a positive integer equal to or greater than one. Switching system 300 further includes one or more switch cards, such as switch cards 303-1 through 303-Q ("303") for Q a positive integer greater than or equal to one. At least one line card 301 is interconnected to at least one switch card 303 across backplane 302. More particularly, two or more line cards 301 may be interconnected to at least one switch card 303 across backplane 302.

Each line card 301 may include one or more physical-layer devices ("PHYs"), such as physical-layer devices 311 of line card 301-1 for example. Physical layer devices 311 may communicate directly with line interfaces, where such line interfaces may be optical fibers, coaxial cables, metal wire conductors, or other medium for communicating signals. Such line interfaces are generally known and are not shown in FIG. 3 for purposes of clarity and not limitation. Physical-layer devices 311 may be connected to one or more line card protocol processors, such as protocol processors 312 for example. For example, in a telecommunications system, protocol processor 312 may be referred to as a framer, where such a framer may be used for processing SONET, SDH, OTN, or other types of frames. Furthermore, for example, in an Ethernet-based system, protocol processor 312 may be referred to as a media access controller ("MAC").

A line card protocol processor 312 may communicate directly with a switch card 303 via backplane 302. Optionally, protocol processor 312 may communicate with a switch card 303 via another line card device or other line card devices 313. Such devices 313 may, for example, include network processors, traffic managers, memory modules, and/or backplane interface devices. For example, memory may be used for packet buffering in a lookup table. Again, it should be appreciated that there may be more than one switch card 303, where multiple switch cards may be used for switching scalability and/or redundancy.

Bidirectional arrows 341 through 343 in FIG. 3 generally represent electrical links, which may involve multiple traces. For each of such links, a high-speed serial transmitter may drive a symbol from one end of the link to the other end of the link, where a high-speed serial receiver receives and interprets such symbol. In other instances, die-to-die links may be driven in parallel.

Each of switch cards 303 includes at least one backplane switch, such as backplane switches 330-1 through 330-Q ("330") for example. Backplane switches 330 may be implemented with multichip modules ("MCMs") as described below in additional detail.

Figure 4:
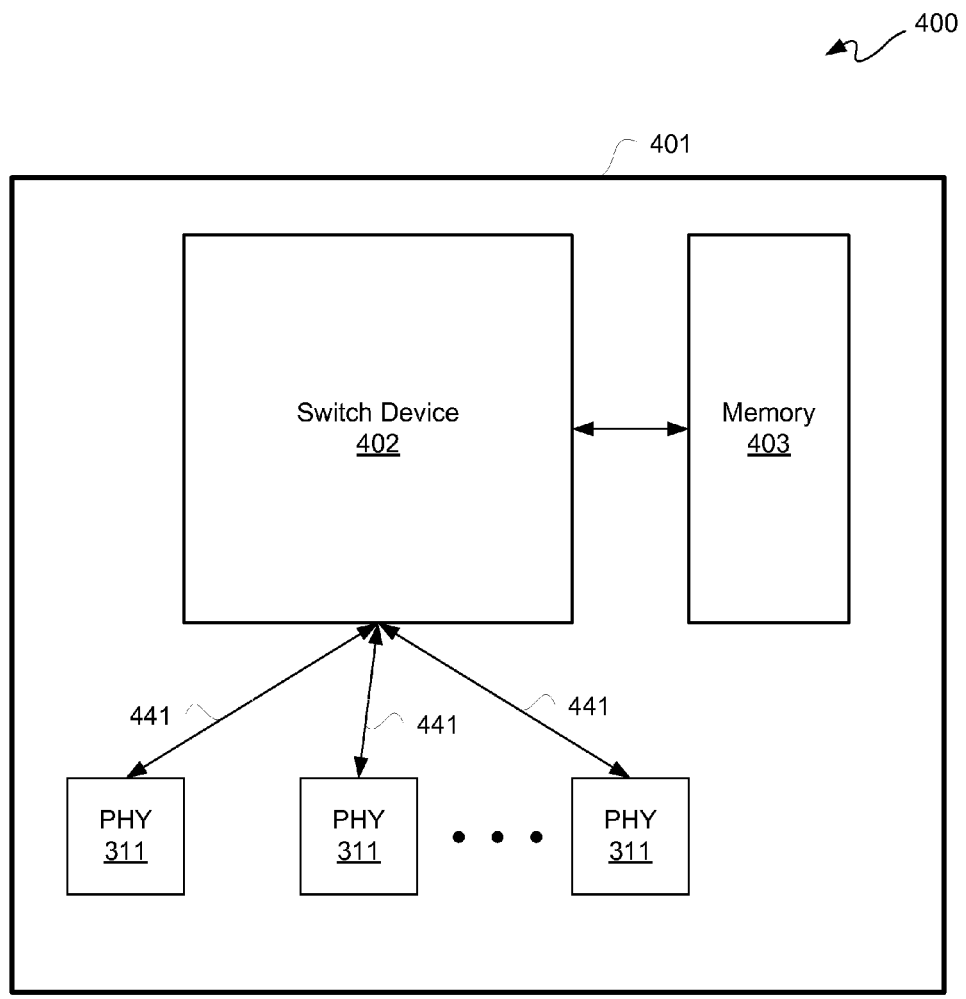
FIG. 4 is a block diagram depicting an exemplary embodiment of a single-board switching system.

FIG. 4 is a block diagram depicting an exemplary embodiment of a single-board switching system 400. For switching systems implemented as desktop switches, stackable switches, or the like, generally a single motherboard, such as motherboard 401 for example, is used. Motherboard 401 may include a switch device 402, memory 403, and physical-layer devices 311, among other components which are not illustratively depicted herein for purposes of clarity and not limitation.

Switch device 402 may be implemented with a multichip module, as described below in additional detail. Switch device 402 may be coupled for communication with memory 403 and may be coupled for communication with physical-layer devices 311.

Bidirectional arrows 441 in FIG. 4 generally represent electrical links, which may involve multiple traces. For each of such links, a high-speed serial transmitter may drive a symbol from one end of the link to the other end of the link, where a high-speed serial receiver receives and interprets such symbol.

Figure 5:
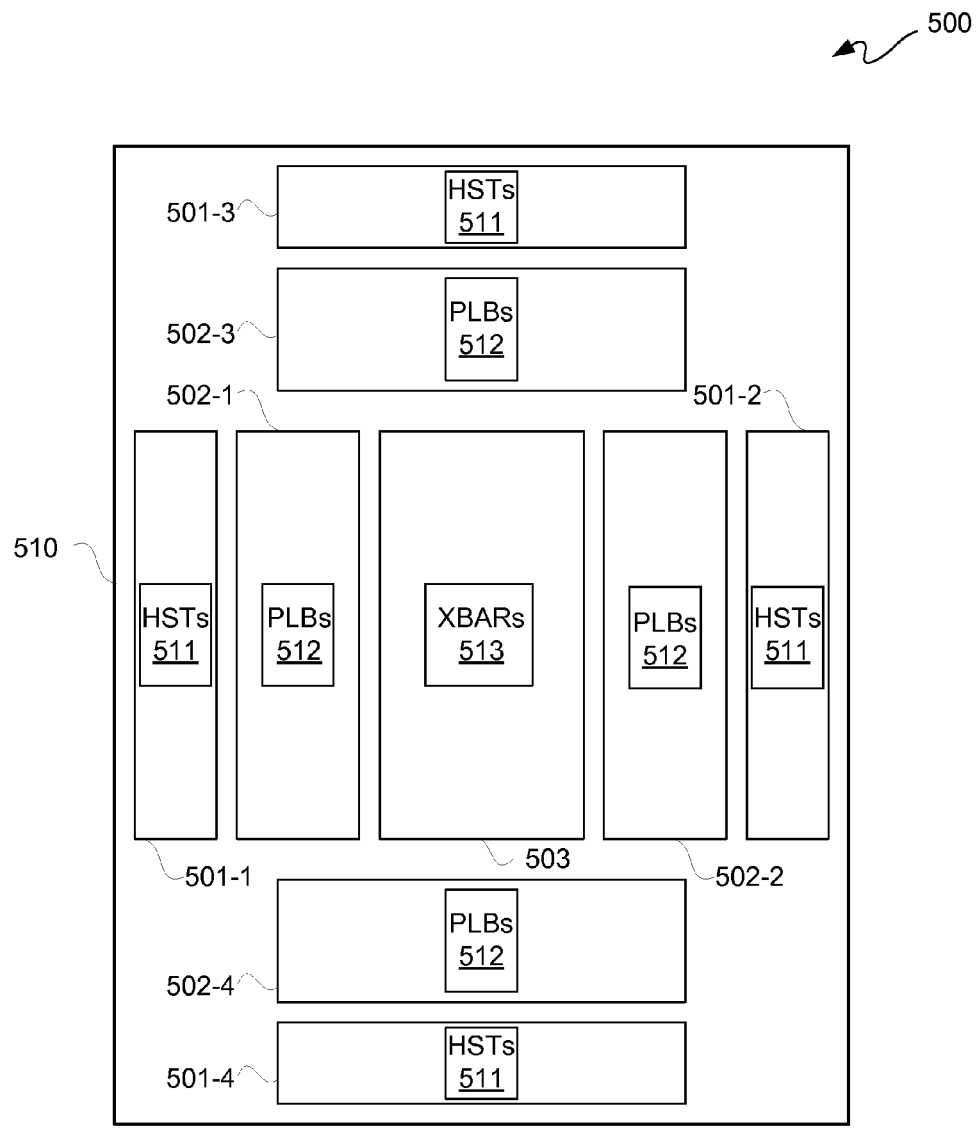
FIG. 5 is a block diagram depicting an exemplary embodiment of a multichip module.

FIG. 5 is a block diagram depicting an exemplary embodiment of a multichip module 500. Multichip module 500 includes three types of integrated circuit die, namely a transceiver die, a protocol logic blocks die, and a crossbar switch die, all of which are coupled to an interposer 510. Multichip module 500 may be used, for example, as a switch device with associated physical-layer interfaces, such as switch device 402 and physical-layer devices 311 of FIG. 4; a backplane switch, such as backplane switch 330 of FIG. 3; and/or a protocol processor with associated physical-layer interfaces, such as a protocol processor 312 and physical-layer devices 311 of FIG. 3.

In this exemplary embodiment, four transceiver dice 501-1 through 501-4 ("501") are mounted or otherwise coupled to interposer 510. In this exemplary embodiment, each transceiver die 501 has multiple high-speed serial transceivers ("HSTs") 511. Each HST 511 may include one or more high-speed serial transmitters, one or more high-speed serial receivers, and one or more associated clock multiplication and clock distribution circuitry blocks, as described below in additional detail. It should be understood that rather than a transceiver die a separate transmitter die and a separate receiver die may be used. Accordingly, transceiver dice 501 may more generally be thought of as communication dice, whether for bidirectional or unidirectional communication.

In this exemplary embodiment, four protocol logic blocks dice 502-1 through 502-4 ("502") are mounted or otherwise coupled to interposer 510. Each die of protocol logic blocks dice 502 has multiple protocol logic blocks ("PLBs") 512 for implementing protocol processing logic functions. However, it should be understood that protocol logic blocks dice 502 may each include additional components, such as non-HST I/Os, among other components that may be associated with a PLD. In this exemplary embodiment, protocol logic blocks dice 502 are FPGA-based PLBs 512. Thus, it should be understood that protocol logic blocks dice 502 include programmable resources, which may be programmed, for example with one or more configuration bitstreams, to provide protocol processing logic functions in hardware.

It should be understood that dice 501-1, 501-2, 502-1, and 502-2, which may be generally rectangular or square, are all mounted on interposer 510 so as to be parallel or substantially parallel with one another for "side-by-side integration" or "2D integration." Likewise, dice 501-3, 501-4, 502-3, and 502-4, which may be generally rectangular or square, are all mounted to interposer 510 so as to be parallel or substantially parallel with one another for "side-by-side integration" or "2D integration." However, dice 501-1, 501-2, 502-1, and 502-2 are perpendicular or substantially perpendicular in orientation with respect to dice 501-3, 501-4, 502-3, and 502-4 as mounted onto interposer 510.

In this exemplary embodiment, a single crossbar switch die 503 is mounted or otherwise coupled to interposer 510. Crossbar switch die 503 may include one or more crossbar switches ("XBARs") 513. Furthermore, in another embodiment, crossbar switches 513 may include an array of smaller crossbar components, and such crossbar components may be controlled using associated global control signaling.

Interposer 510 in this exemplary embodiment is a passive interposer. In other words, interposer 510 provides only interconnectivity as described below in additional detail. Interposer 510 interconnects respective dice 501 and 502 in respective pairs for bidirectional communication and interconnects dice 502 and 503 for bidirectional communication.

HSTs 511 of transceiver die 501-1 provide a left side physical-layer interface of multichip module 500. Interposer 510 interconnects HSTs 511 of transceiver die 501-1 to PLBs 512 of protocol logic blocks die 502-1. PLBs 512 of protocol logic blocks die 502-1 are interconnected to at least one crossbar switch 513 of crossbar switch die 503 by interposer 510.

HSTs 511 of transceiver die 501-2 provide a right side physical-layer interface of multichip module 500. Interposer 510 interconnects HSTs 511 of transceiver die 501-2 to PLBs 512 of protocol logic blocks 502-2. PLBs 512 of protocol logic blocks die 502-2 are interconnected to at least one crossbar switch 513 of crossbar switch die 503 by interposer 510.

HSTs 511 of transceiver die 501-3 provide a top side physical-layer interface of multichip module 500. Interposer 510 interconnects HSTs 511 of transceiver die 501-3 to PLBs 512 of protocol logic blocks 502-3. PLBs 512 of protocol logic blocks die 502-3 are interconnected to at least one crossbar switch 513 of crossbar switch die 503 by interposer 510.

HSTs 511 of transceiver die 501-4 provide a bottom side physical-layer interface of multichip module 500. Interposer 510 interconnects HSTs 511 of transceiver die 501-4 to PLBs 512 of protocol logic blocks 502-4. PLBs 512 of protocol logic blocks die 502-4 are interconnected to at least one crossbar switch 513 of crossbar switch die 503 by interposer 510.

It should be understood that transceiver dice 501 may all be manufactured with the same set of masking layers. More generally, it should be understood that transceiver dice 501 may all be fabricated the same, with the understanding that there are variations among die even on the same wafer. Likewise, it should be understood that protocol logic blocks dice 502 may all be fabricated the same. Moreover, it should be understood that crossbar switch dice may be manufactured in volume for multiple multichip modules 500. Furthermore, for fabrication of multiple multichip modules 500, dice 501 through 503, as well as interposer 510, may all be produced in volume.

It should also be understood that each die of dice 501 through 503 is a monolithic die; however, each such die of dice 501 through 503 may be substantially smaller than a single monolithic die used to provide an entire backplane switch 330 of FIG. 3, an entire switch device 402 with physical-layer devices 311 of FIG. 4, or an entire protocol processor 312 with physical-layer devices 311 of FIG. 3 (collectively and singly "an entire monolithic switching device"). Thus, it should be understood that more dice per wafer may be candidates for yielding, and yield rates may be higher, for multichip module 500 than for such an entire monolithic switching device.

Along those lines, it should be understood that the ability to manufacture a die repetitively with a limited variety of components may result in both higher yield and smaller die size than a comparable implementation of such circuitry in a monolithic hybridized die, namely one including functions such as transceiving, protocol processing, and crossbar switching, for example. It should further be understood that dice 501 through 503 may be fabricated using different semiconductor processes. For example, HSTs 511 of dice 501 may be fabricated with a more mature and stable process for analog design, and PLBs 512 of dice 502, as well as crossbar switches 513 of die 503, may be fabricated using more advanced semiconductor processes, namely semiconductor processes with more aggressive lithographies. By more aggressive lithographies, it should generally be understood that an advanced semiconductor process generally has a smaller minimum dimension feature size than a less advanced semiconductor process.

For purposes of clarity by way of example and not limitation, an exemplary embodiment of a switching fabric provided by a multichip module 500 is described. However, it should be understood that many variations, including numerical variations, from this example embodiment may be used. For a 1.28 terabit per second ("Tbps") embodiment, interposer 510, which may be a silicon interposer for example, may have mounted thereto: four transceiver dice 501 each with 32 10 gigabit per second ("Gbps") HSTs 511; four protocol logic blocks dice 502; and one crossbar switch die 503 with two crossbar switches 513. Thus, generally, four I/O-PLD pairs may be respectively coupled to one of the four interfaces, generally "edges" or "sides," of crossbar switch die 503 to form a switch fabric product. Optionally, such switch fabric product may be implemented with fewer but higher-speed transceivers. For example, four transceiver dice 501 may each have 16 20 Gbps HSTs 511. Furthermore, it should be understood that HSTs 511 need not all be the same on a transceiver die 501. For example, there may be 25 Gbps and 10 Gbps HSTs 511 on the same transceiver die 501, where both of such HSTs may communicate with PLBs 512 using a same parallel interface, namely switching data between such two different types of HSTs.

It should further be understood that an interface between an HST 511 and PLBs 512 need not be a parallel interface. For example, low-power serial transceivers, such as use for driving silicon interposer wires, may be used for such an interface. Additionally, one HST 511 may be coupled with more than one of PLBs 512. Likewise, one PLB 512 may be coupled with more than one HST 511.

It should be understood that different combinations of dice 501 through 503, including different internal configurations thereof, may be used to provide different switch fabric products. Furthermore, because PLBs 512 may contain programmable resources, such as FPGA-based programmable resources, such switch fabric products may have their PLBs hardware reconfigured, including customer or field reconfiguration in contrast to reconfiguration at a factory.

Thus, it should be understood that flexibility with respect to protocol processing may be provided with such ability to reconfigure PLBs 512. Furthermore, it should be understood that multiples of different configurations of entire monolithic switching devices may be supplanted with a single multichip module 500. Additionally, it should be appreciated that long design lead times associated with large, monolithic devices may be circumvented, as a manufacture of multichip module 500 may design each die of dice 501 through 503 separately in various configurations for later assembly to provide switch fabric products on demand, namely only when a customer purchases or otherwise requests such product configuration.

It should be understood that in current semiconductor manufacturing using 80 nanometer or less lithography, transistors of a die are conventionally formed with a single orientation. Forming transistors with multiple orientations conventionally leads to lower yields or other additional costs of manufacturing. For example, layout macros for monolithic semiconductor fabricated integrated circuits using advanced lithographic processing may have all transistor gates that run in a same direction. Some vendors of integrated circuits may create two macros, namely one for each orientation or direction of gates, but this may add significant cost, as previously described.

However, by having multiple rectangular dice, such as dice 501 and 502 for example, the entire die may be rotated, such as by 90° for example, in order to more suitably accommodate data flows from different directions, such as connectivity along multiple sides of an interposer 510, for example. More particularly, even though transistors in each die of transceiver dice 501, for example, may have a same orientation, transceiver dice 501 may be oriented differently from one another.

For example, transceiver die 501-1 is a leftmost outer die, where physical-layer interfaces may be positioned corresponding to a leftmost edge of interposer 510. Transceiver die 501-3 is a topmost outer die, where physical-layer interfaces may be positioned corresponding to a topmost edge of interposer 510. Even though transceiver die 501-1 and transceiver die 501-3 may be formed on the same wafer with a same transistor orientation, such dice may be rotated 90° with respect to one another in order to provide better positioning for connecting physical interfaces. Along those lines, transceiver die 501-2 is a rightmost outer die, where physical-layer interfaces may be positioned corresponding to a rightmost edge of interposer 510. Again, even though transceiver die 501-1 and transceiver die 501-2 may be formed on the same wafer with a same transistor orientation, such dice may be rotated 180° with respect to one another in order to provide better positioning for connecting physical interfaces. Lastly, transceiver die 501-4 is a bottommost outer die, where physical-layer interfaces may be positioned corresponding to a bottommost edge of interposer 510. Once again, even though transceiver die 501-1 and transceiver die 501-4 may be formed on the same wafer with the same transistor orientation, such dice may be rotated −90° with respect to one another or to provide better positioning for connecting physical interfaces. Likewise, protocol logic blocks dice 502-1 through 502-4 may be correspondingly rotated for interconnecting to transceiver dice 501-1 through 501-4, respectively.

Generally, a maximum bandwidth of a crossbar switch is substantially greater than the maximum bandwidth of transceivers coupled to such crossbar switch. Accordingly, transceivers may be a limiting bandwidth component of multichip module 500.

Figure 6:
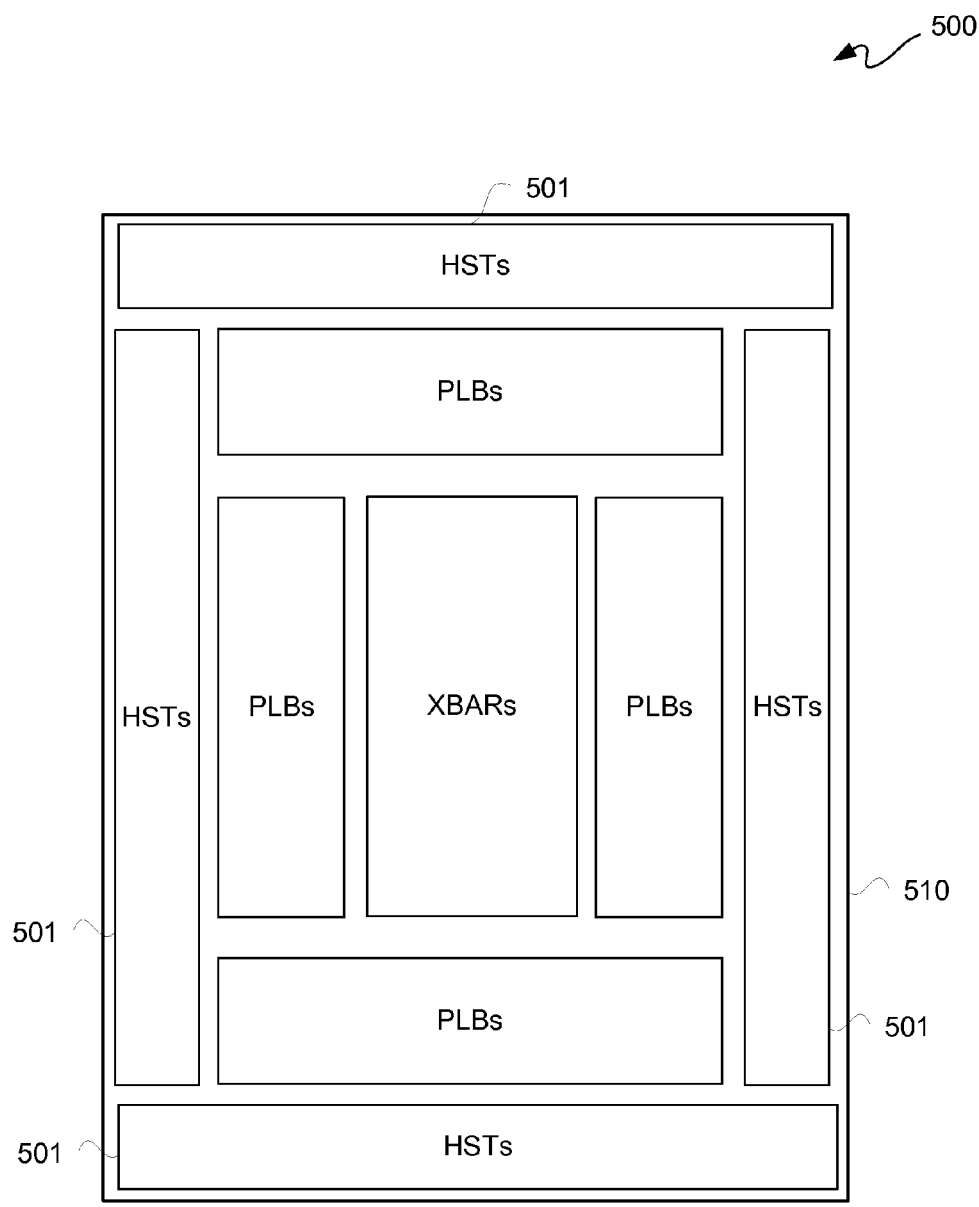
FIG. 6 is a block diagram depicting another exemplary embodiment of multichip module.

FIG. 6 is a block diagram depicting another exemplary embodiment of multichip module 500. In this exemplary embodiment, transceiver dice 501 are elongated to more fully take advantage of the length and width of interposer 510. Thus, transceiver dice 501 may have more transmit and receive resources in order to increase bandwidth of multichip module 500. It should be appreciated that a passive interposer fabricated using a semiconductor substrate, such as a silicon substrate, for example, may have substantial room for accommodating multiple traces for providing interconnections. However, elongated transceiver dice 501 may be more difficult to yield and/or may not physically fit in some applications.

Figure 7:
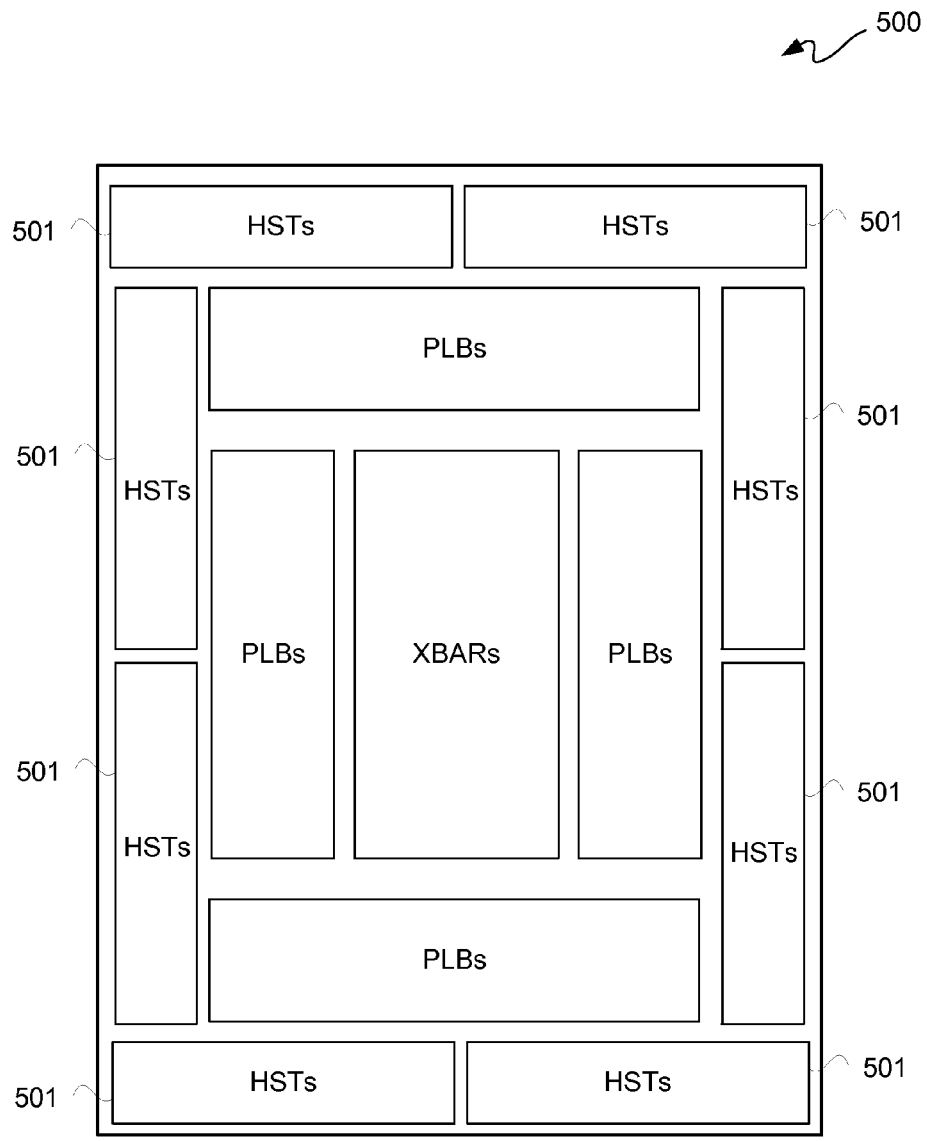
FIG. 7 is a block diagram depicting yet another exemplary embodiment of a multichip module.

FIG. 7 is a block diagram depicting yet another exemplary embodiment of multichip module 500. In this exemplary embodiment, transceiver dice 501 are shortened to more fully take advantage of the length and width of interposer 510. However, rather than a single transceiver die 501 for each edge of interposer 510, two transceiver dice 501 are used for each edge of interposer 510. Again, it should be understood that each transceiver die 501 may be manufactured from the same wafer, and just rotated for mounting to interposer 510. Even though the example of two transceiver dice 501 are used for each edge, it should be appreciated that more than two dice may be used.

Figure 8:
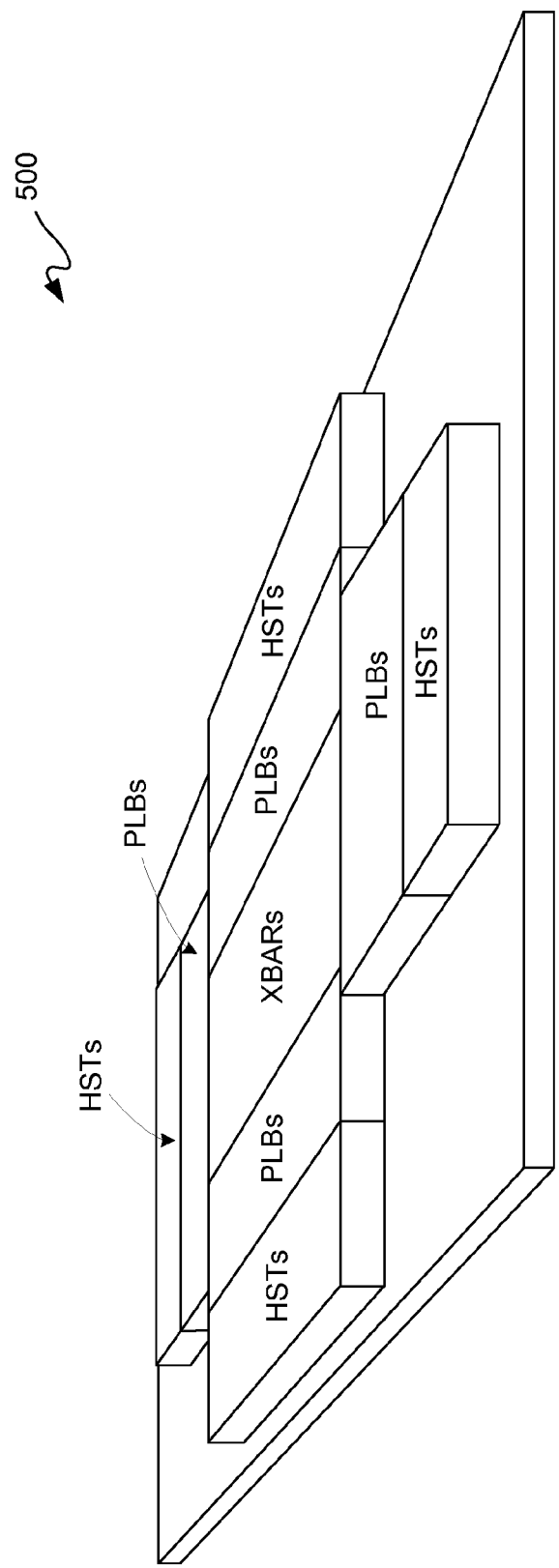
FIG. 8 is a perspective view block diagram depicting an exemplary embodiment of a multichip module.

FIG. 8 is a perspective view block diagram depicting an exemplary embodiment of a multichip module 500. It should be understood that dice 501 through 503 may be upper-tier components of multichip module 500, and that interposer 510 may be a lower-tier component of multichip module 500.

Figure 9:
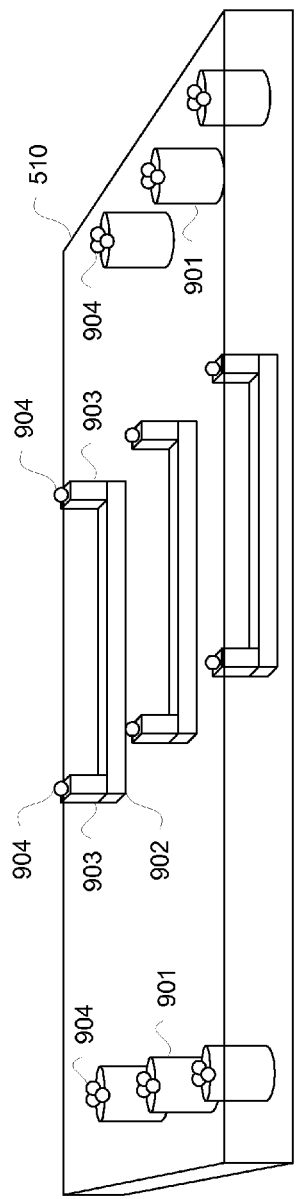
FIG. 9 is a perspective view block diagram with some transparency for depicting an exemplary embodiment of an interposer of the multichip module of FIG. 8.
Figure 10:
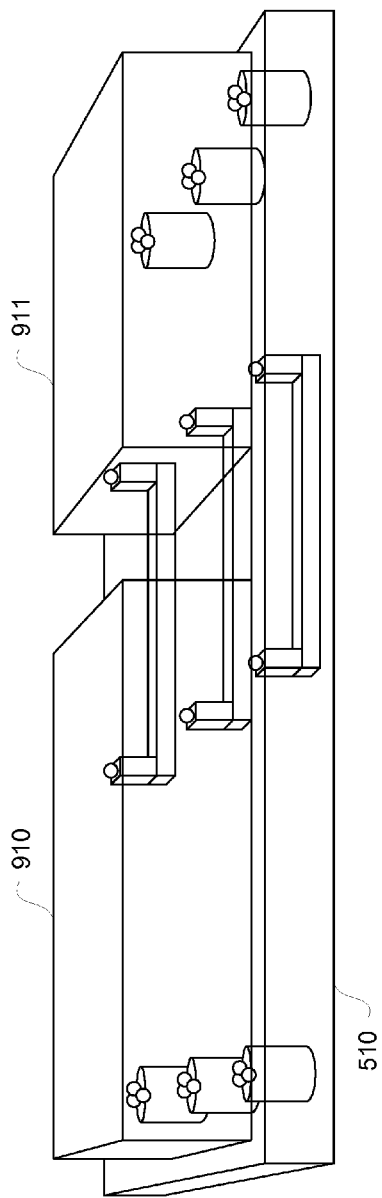
FIG. 10 is the perspective view block diagram of FIG. 9 with upper-tier components.

FIG. 9 is a perspective view block diagram with some transparency for depicting an exemplary embodiment of interposer 510 of multichip module 500 of FIG. 8. FIG. 10 is the perspective view block diagram of FIG. 9 with upper-tier components 910 and 911, which generally represent a pair of dice 501 and 502 or a pair of dice 502 and 503. Interposer 510 is further described with simultaneous reference to FIGS. 8 and 9.

Interposer 510 may be formed with multiple through-conductive vias, such as generally represented with through-silicon vias ("TSVs") 901, for example. In interposer 510, conductive traces, such as metal wires 902 for example, may be formed. Even though only a single conductive layer is illustratively depicted within interposer 510, it should be understood that multiple conductive layers may be implemented. Vias 903 may be used to connect from a top surface of interposer 510 down to metal wires 902. Microbumps 904 may be used for interconnecting vias 901 and 903 to upper tier components 910 and 911.

Figure 11:
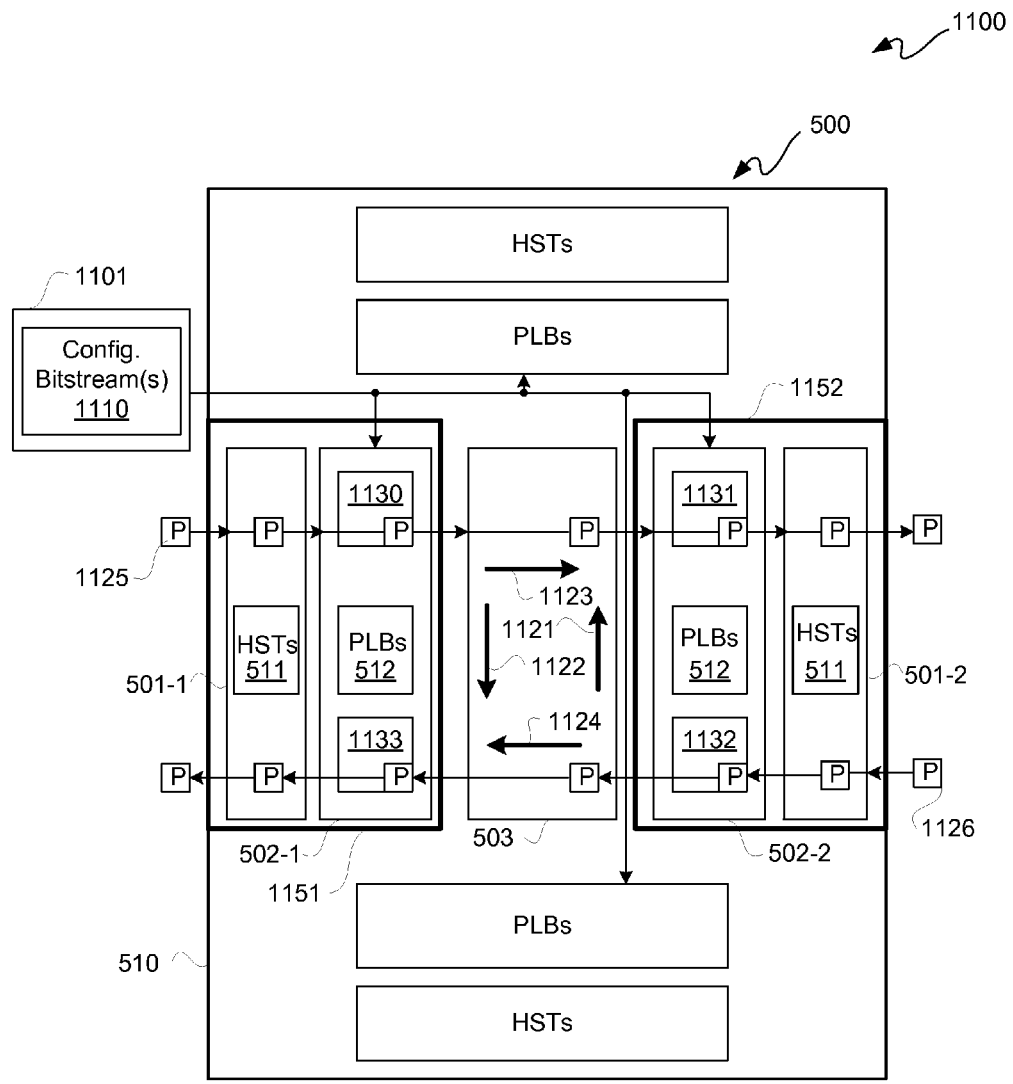
FIG. 11 is a block diagram depicting an exemplary embodiment of a reconfigurable system.

FIG. 11 is a block diagram depicting an exemplary embodiment of a reconfigurable system 1100. Reconfigurable system 1100 includes storage 1101 and multichip module 500. Storage 1101 is coupled to dice 502 for configuring PLBs 512 thereof, such as to provide an ingress processing function and an egress processing function as described below in additional detail. Storage 1101 may store one or more configuration bitstreams 1110. Even though reconfigurable system 1100 is described in terms of having a switch card using a multichip module 500 for purposes of clarity by way of example, it should be understood that a multichip module 500 as described herein may be on a line card or other type of circuit board in other embodiments of a reconfigurable system.

For purposes of clarity by way of example and not limitation, only a direction from left to right across multichip module 500, as generally indicated by arrow 1123, is described in detail. However, it should be understood that communication traffic may be received along any side of multichip module 500 and switched to any other side of multichip module 500, as generally indicated by arrows 1121 through 1124.

A packet 1125 may be received by transceiver die 501-1. Such packet may be passed from transceiver die 501-1 to protocol logic blocks die 502-1 via interposer 510. Responsive to one or more configuration bitstreams 1110 provided to protocol logic blocks dice 502-1 and 502-2, an ingress processing block 1130 and an egress processing block 1131 may be respectively instantiated in programmable resources of protocol logic blocks dice 502-1 and 502-2. In other words, ingress processing block 1130 and egress processing block 1131 may be respectively instantiated to execute according to a "first" protocol. Such first protocol may be specified by a consumer, such as a manufacture of a network switch or router for example. Such instantiation may be performed by a manufacture of multichip module 500 or by such consumer of multichip module 500.

Packet 1125 is provided from transceiver die 501-1 to ingress processing block 1130. Ingress processing block 1130 may perform ingress processing on packet 1125 according to such first protocol. For purposed of clarity by way of example and not limitation, it shall be assumed that such ingress processing includes wrapping such packet 1125 in a wrapper. Such wrapped packet 1125 may be passed from protocol logic blocks die 502-1 to crossbar switch die 503 and from crossbar switch die 503 to egress processing block 1131. Egress processing block 1131 may perform egress processing on such ingress processed packet 1125. Again, for purposes of clarity by way of example and not limitation, it shall be assumed that such egress processing includes unwrapping such wrapped packet 1125 to provide such unwrapped packet 1125 to transceiver die 501-2. Transceiver die 501-2 may communicate packet 1125 off of multichip module 500. Accordingly, it should be understood that in other embodiments, such ingress and egress processing may or may not respectively include wrapping and unwrapping.

If the first protocol is changed, ingress processing block 1130 and egress processing block 1131 may be reconfigured in order to accommodate such changed protocol. If another protocol, namely a second protocol, is to be supported instead of or in addition to the first protocol, programmable resources of protocol logic blocks dice 502-1 and 502-2 may be configured again to provide such support.

With continuing reference to FIG. 11, a packet 1126 is illustratively depicted as being received by transceiver die 501-2 for processing right-to-left across multichip module 500 as generally indicated by arrows. Accordingly, an ingress processing block 1132 may be instantiated in programmable resources of protocol logic blocks die 502-2 to support a "second" protocol different from the first protocol, and an egress processing block 1133 may be instantiated in protocol logic blocks die 502-1 to support such second protocol. Accordingly, such ingress processing block 1132 and egress processing block 1133 may be instantiated by a provider of multichip module 500 or by a consumer thereof. Thus it should be understood that a protocol stack may be implemented in a multichip module 500 for supporting multiple protocols across one or more crossbar switches 513.

It should be appreciated that multichip module 500 provides a field-programmable switch fabric. Because PLB components are field-programmable, switch fabric provided by multichip module 500 may be reconfigured for different protocols, and thus a single switch device may be used in different applications. In other words, rather than having a variety of entirely monolithic switching devices for various application contexts, a number of multichip modules 500, which is a subset of the number of such variety of entirely monolithic switching devices, may span such application contexts. Furthermore, combining different numbers of HSTs, PLBs and crossbar switches may yield different switching throughputs in order to accommodate various application contexts.

It should be appreciated that multichip module 500 may be implemented with two instances of transceiver dice 501 and two instances of programmable logic blocks dice 502. Furthermore, for low-power applications having fewer connections and/or consuming less bandwidth, instances of transceiver die 501 and protocol logic blocks die 502 may effectively be combined into a single HST-PLB die, such as generally depicted by boxes 1151 and 1152. In other embodiments, a single instance of a transceiver die 501 and a single instance of a protocol logic blocks die 502 may be interconnected to one another via an interposer 510, and such single instance of such protocol logic block die 502 may be interconnected to a crossbar switch die 503 via such interposer 510, where such single instances of dice 501 through 503, as well as in interposer 510, provide a multichip module 500.

Figure 12:
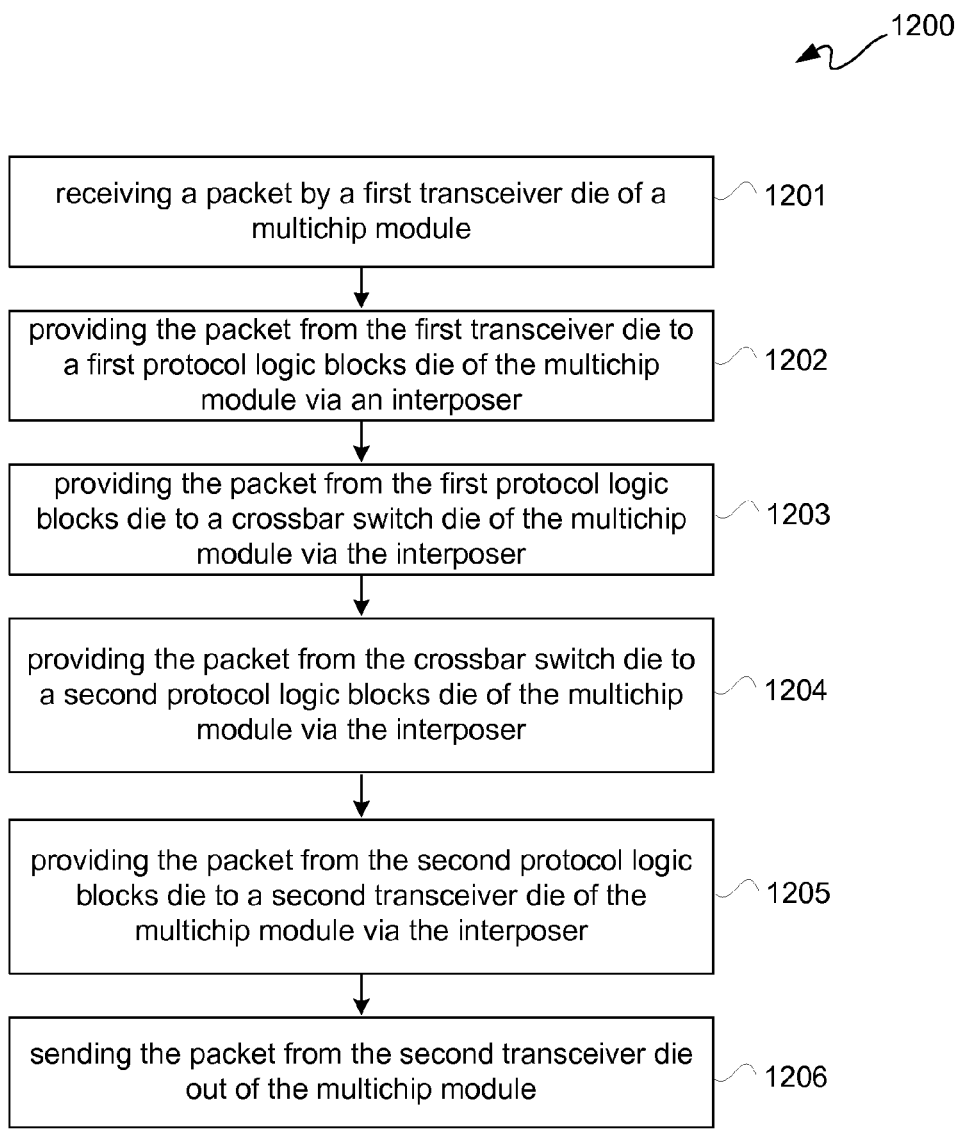
FIG. 12 is a flow diagram depicting an exemplary embodiment of a process for communication.

FIG. 12 is a flow diagram depicting an exemplary embodiment of a process for communication 1200. At 1201, a packet is received by a first transceiver die of a multichip module. For example, a multichip module 500 may receive a packet to a transceiver die 501 thereof, such as previously described herein. At 1202, such packet is provided from the first transceiver die to a first protocol logic blocks die of such multichip module via an interposer. For example, a transceiver die 501 may pass a packet to a protocol logic blocks die 502 of such multichip module 500 via an interposer 510 of such multichip module 500, such as previously described herein.

At 1203, the packet from the first protocol logic blocks die is provided to a crossbar switch die of the multichip module via the interposer. For example, a protocol logic blocks die 502 may pass a packet to a crossbar switch die 503 via such interposer 510 of such multichip module 500, such as previously described herein. At 1204, the packet from the crossbar switch die is provided to a second protocol logic blocks die of the multichip module via the interposer. For example, such packet may be passed from such crossbar switch die 503 to another protocol logic blocks die 502 via such interposer of such multichip module 500, such as previously described herein.

At 1205, the packet from the second protocol logic blocks die is provided to a second transceiver die of the multichip module via the interposer. For example, such packet may be passed from such other protocol logic blocks die 502 to another transceiver die 501 via such interposer of such multichip module 500, such as previously described herein. At 1206, the packet from the second transceiver die is sent out of the multichip module, such as previously described herein. For example, such packet may be sent out of such multichip module 500 via such other transceiver die 502.

In another embodiment, such packet may be passed from such crossbar switch die 503 back to such protocol logic blocks die 502 via such interposer 510 of such multichip module 500. In such other embodiment, such packet passed back may be further passed from such protocol logic blocks die 502 back to such transceiver die 501 via such interposer 510 of such multichip module 500, as described below in additional detail with reference to FIG. 17. For such other embodiment, the first transceiver die and the second transceiver die may be one and the same, and the first protocol logic blocks die and the second protocol logic blocks die may be one and the same.

Figure 13:
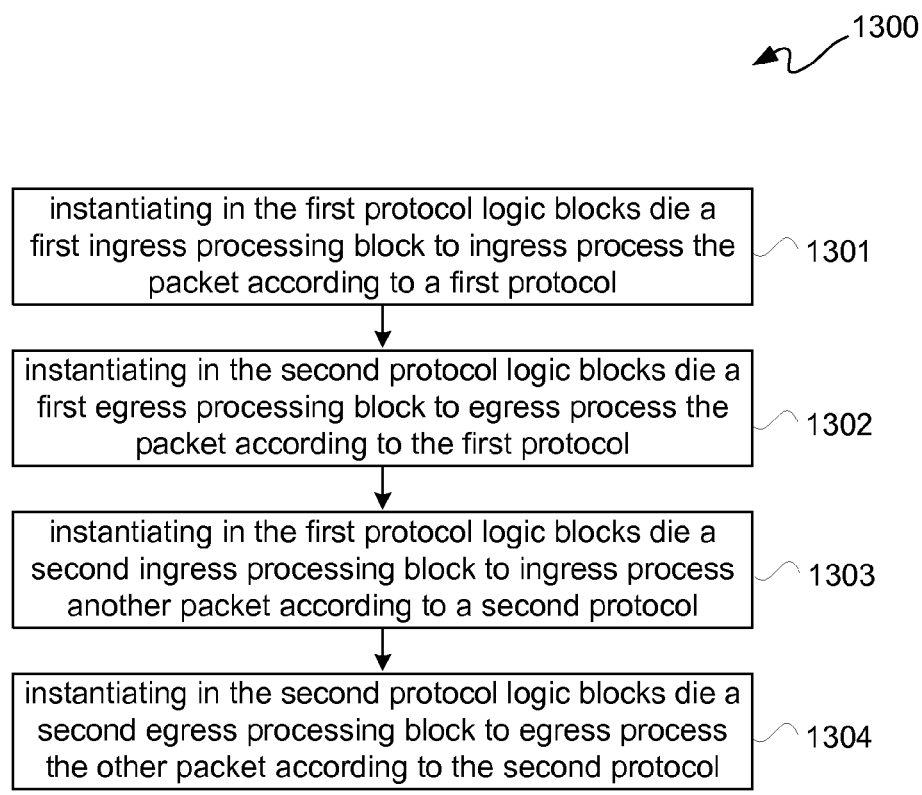
FIG. 13 is a flow diagram depicting an exemplary embodiment of an instantiation flow.

FIG. 13 is a flow diagram depicting an exemplary embodiment of an instantiation flow 1300. At 1301, an ingress processing block is instantiated in a first protocol logic blocks die. Such ingress processing block is to ingress processes, such as wrap for example, one or more packets according to a first protocol. Such instantiation may include field programming of programmable resources of such a first protocol logic blocks die, as previously described herein. At 1302, an egress processing block is instantiated in a second protocol logic blocks die. Such egress processing block is to egress process, such as unwrap for example, such one or more packets, namely for example after being wrapped at 1301 according to such a first protocol. Such instantiation may include field programming of programmable resources of such a second protocol logic blocks die, as previously described herein.

At 1303, another ingress processing block is instantiated in the first protocol logic blocks die. Such other ingress processing block is to ingress process, for example wrap, one or more packets according to a second protocol. The second protocol is different from the first protocol. Such instantiation may include field programming of programmable resources of a second protocol logic blocks die, as previously described herein. At 1304, another egress processing block is instantiated in such second protocol logic blocks die. Such other egress processing block is to egress processes, for example unwrap, such one or more packets, namely for example after being wrapped at 1303 according to such a second protocol. Such instantiation may include field programming of programmable resources of such a second protocol logic blocks die, as previously described herein.

Figure 14:
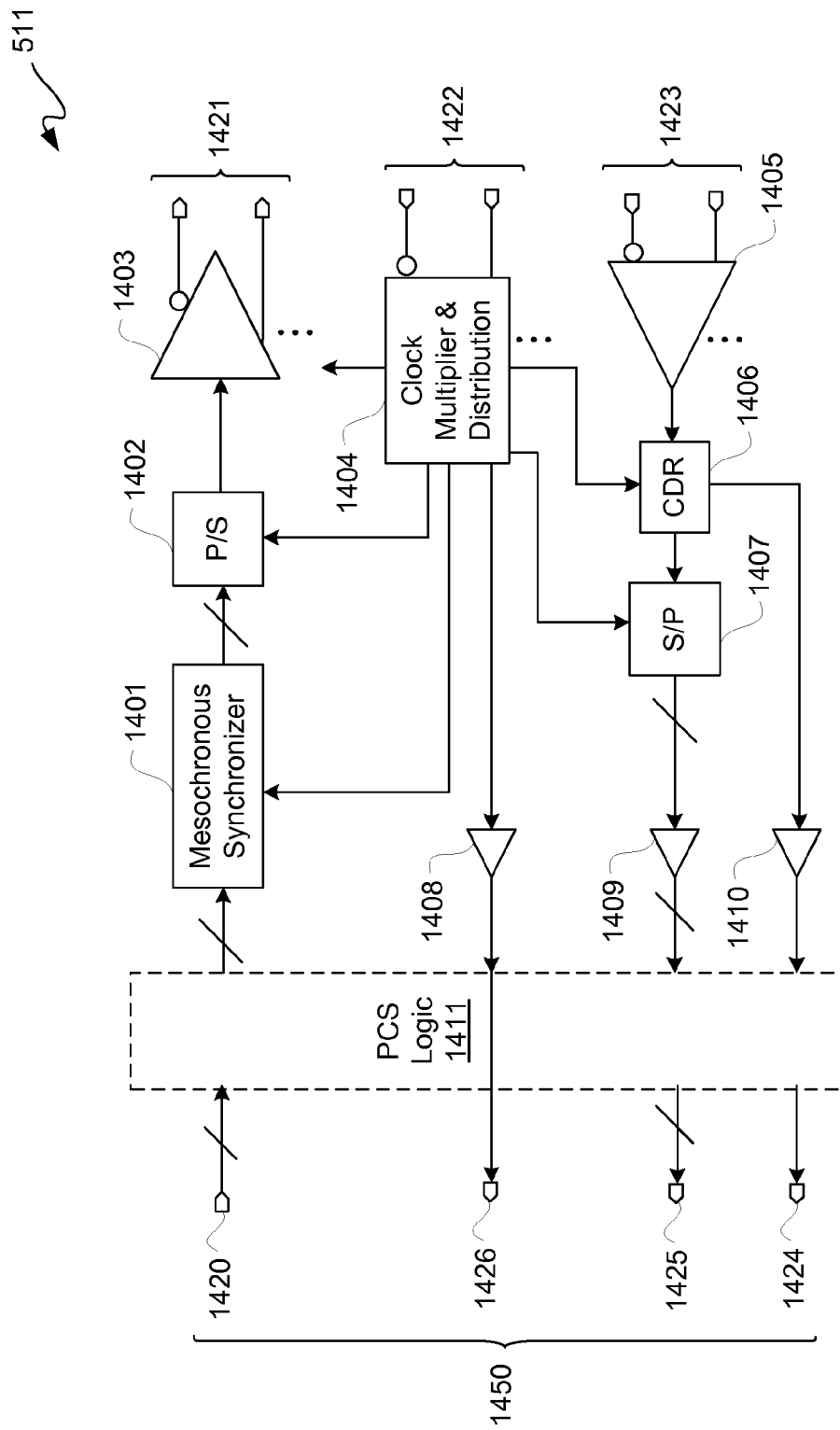
FIG. 14 is a circuit diagram depicting an exemplary embodiment of a high-speed serial transceiver ("HST").

FIG. 14 is a circuit diagram depicting an exemplary embodiment of an HST 511. HST 511 may include mesochronous synchronizer 1401, a parallel-to-serial converter ("P/S") 1402, one or more differential transmitters 1403, one or more clock multiplier and distribution blocks 1404, one or more differential receivers 1405, a clock data recovery ("CDR") block 1406, a serial-to-parallel converter ("S/P") 1407, buffers 1408 through 1410, and optionally physical-coding sublayer ("PCS") logic block 1411.

Parallel data 1420 may be input to HST 511 for mesochronous synchronizer 1401, which may be clocked responsive to a clock signal from clock multiplier distribution block 1404. Output of mesochronous synchronizer 1401 may be provided to P/S 1402, where P/S 1402 is clocked responsive to a clock signal from clock multiplier and distribution block 1404. Serial data output from P/S 1402 may be provided as an input to differential transmitter 1403 to provide high-speed differential serial output 1421. Reference clock signals 1422 may be provided as input to clock multiplier and distribution block 1404 for generation of clock signals therein for output.

High-speed differential serial data 1423 may be received by differential receiver 1405 for output to CDR block 1406, which is clocked responsive to a clock signal from clock multiplier and distribution block 1404. A recovered clock signal may be output from CDR block 1406 for input to buffer 1410 to provide a recovered clock signal 1424 as an output.

A recovered bitstream output from CDR block 1406 may be input to S/P 1407, which is clocked responsive to clock signal from CDR block 1406. Recovered parallel data may be output from S/P 1407 for input to buffer 1409. Output of buffer 1409 may be recovered parallel data bitstreams 1425.

A reference clock signal may be output from clock multiplier and distribution block 1404 for input to buffer 1408, and output from buffer 1408 may be provided as a reference clock signal 1426. Power and ground supplies, not shown herein for purposes of clarity and not limitation, as well as reference clock signals 1422, may be connected to HST 511 using for example TSVs for package pins of a multichip module 500.

Recovered parallel data bitstreams 1425 and recovered clock signal 1424 may be used by one or more protocol logic blocks for subsequent processing. Interface 1450 may be interconnected with interposer 510 to one or more PLBs 512 of a protocol logic blocks die 502 of FIG. 5.

Optional PCS logic block 1411 may include logic for pre-processing and post-processing of communication traffic. PCS logic block 1411 may be implemented using programmable resources and/or dedicated circuits, such as standard cells or programmable resources fabric. A hardened implementation using standard cells may involve less semiconductor area, but may lack ability to be reconfigured in the field.

Figure 15:
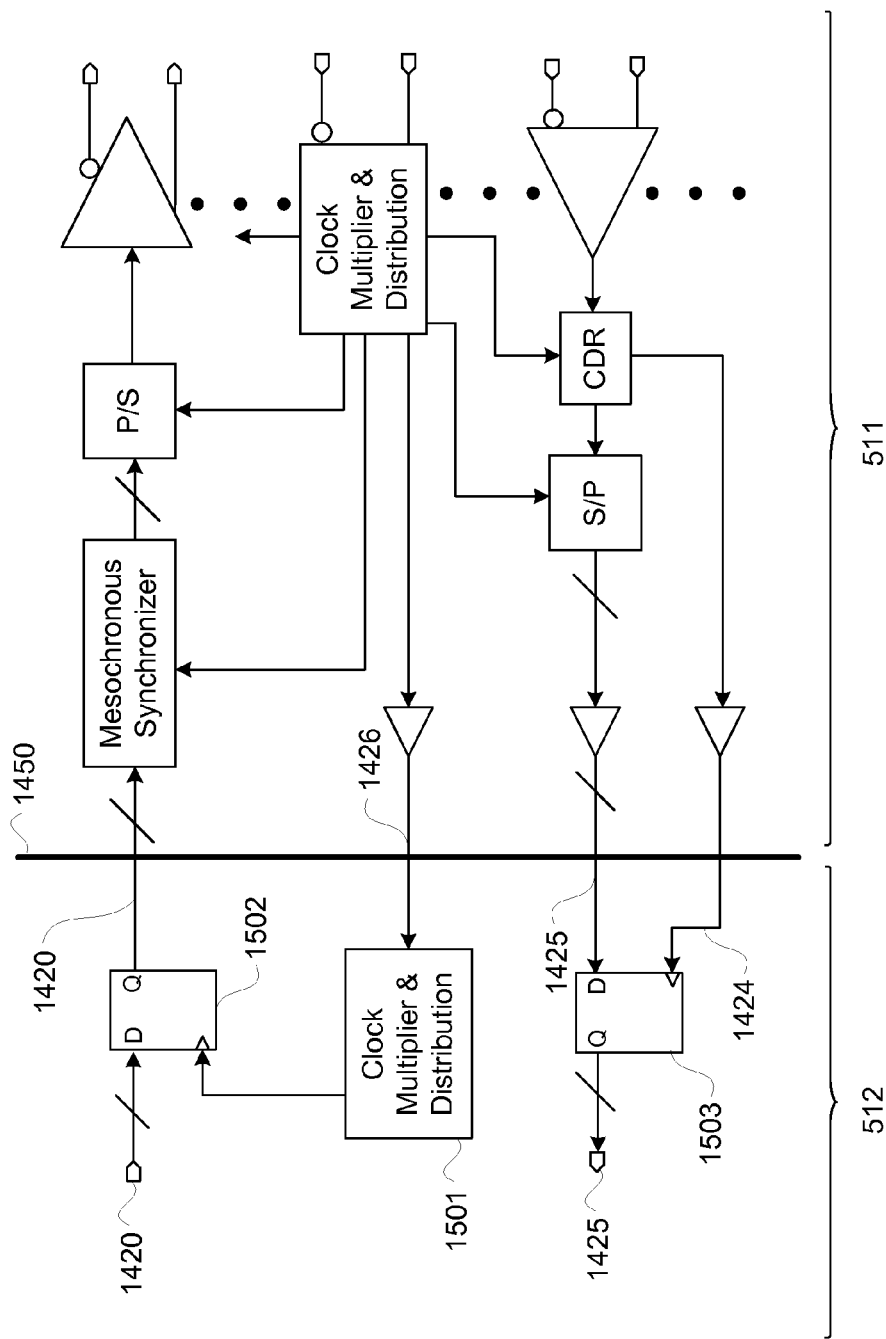
FIG. 15 is a circuit diagram depicting an exemplary embodiment of an HST coupled to a protocol lock block ("PLB").

FIG. 15 is a circuit diagram depicting an exemplary embodiment of an HST 511 coupled to a PLB 512. PLB 512 may include clock multiplier distribution block 1501, register 1502, and register 1503. Parallel data 1420 may be provided as an input to register 1502 for output as parallel data 1420 for input to HST 511. Register 1502 may be clocked by a clock signal from clock multiplier distribution block 1501. Clock multiplier distribution block 1501 may receive reference clock signal 1426 as a reference clock. Register 1503 may receive recovered parallel data bitstreams 1425. Register 1503 may be clocked responsive to recovered clock signal 1424 for input and output of recovered parallel data bitstreams 1425.

In an embodiment, registers 1502 and 1503, as well as clock multiplier distribution block 1501, may be implemented using programmable resources. However, in another embodiment, such as to improve performance, save power, or have better area efficiency, registers 1502 and 1503, as well as clock multiplier distribution block 1501, may be implemented using dedicated circuitry. Furthermore, more currently popular protocols may be hardened in protocol logic blocks dice 502, while having programmable resources for other protocols.

Figure 16:
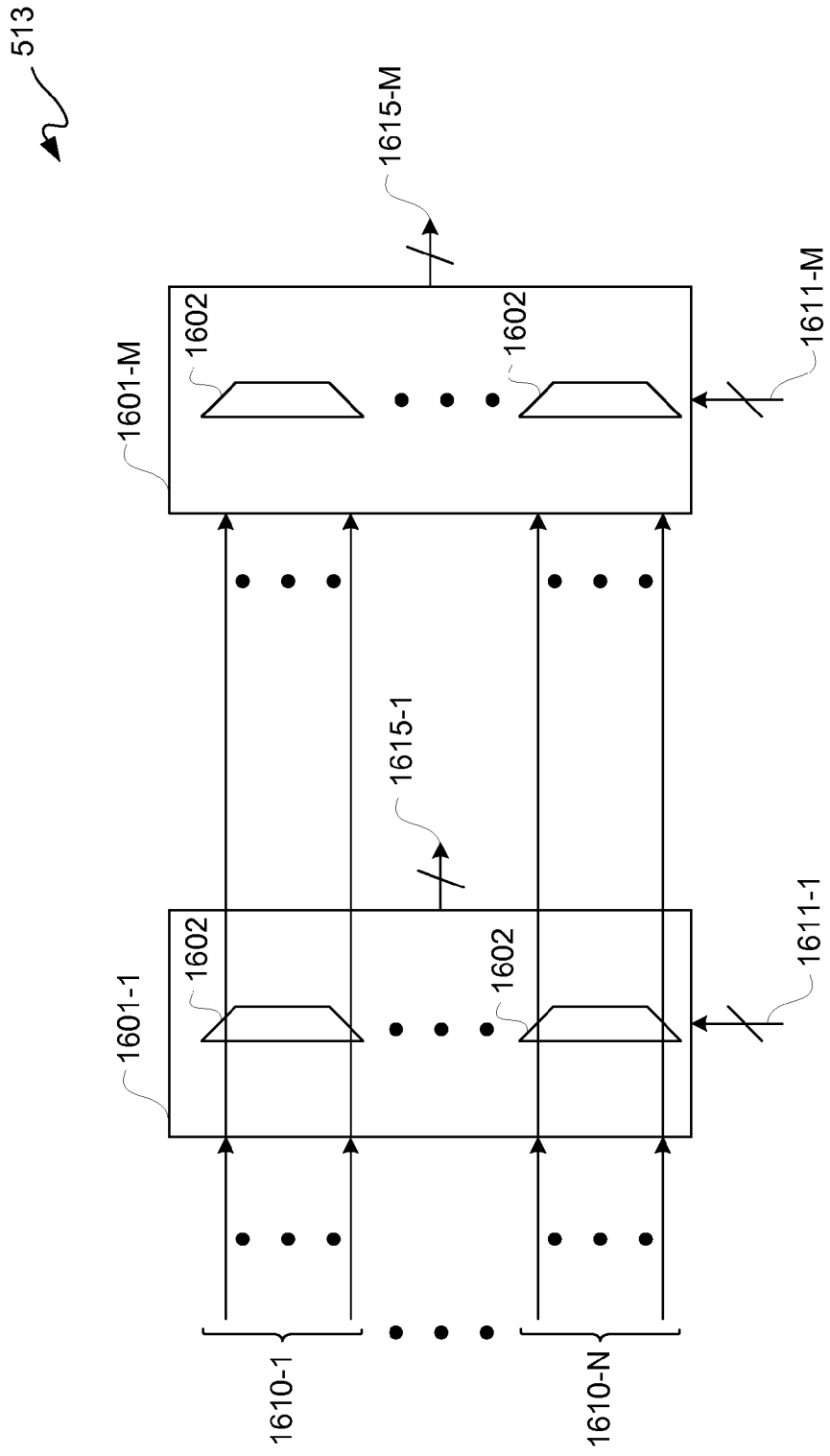
FIG. 16 is a block/circuit diagram depicting an exemplary embodiment of a crossbar switch.

FIG. 16 is a block/circuit diagram depicting an exemplary embodiment of a crossbar switch 513. Crossbar switch 513 may operate in a single clock domain, namely, as a synchronous crossbar switch. However, one or more crossbar switches operating with different clock domains may be used. Furthermore, crossbar switch 513 may be a synchronous buffered crossbar switch, namely a crossbar switch with a relatively small FIFO at each crosspoint. In another embodiment, an asynchronous crossbar switch, sometimes referred to as a crosspoint switch, may be used. An asynchronous crossbar switch may carry an embedded clock for each input data stream. Asynchronous crossbar switches may, for example, be used in optical switching and video switching.

Crossbar switch 513 includes output multiplexer blocks 1601-1 through 1601-M ("1601"), for M a positive integer greater than one. Output multiplexer blocks 1601 each include multiple multiplexers 1602. For each multiplexer 1602 designated as a port, there may be a respective input port 1610. Thus, each of output multiplexer blocks 1601 has input ports 1610-1 through 1610-N, for N a positive integer greater than one, and where each such port is B bits for B a positive integer equal to or greater than 1.

Multiplexer select signals 1611-1 through 1611-M ("1611") are respectively provided as control select signals to output multiplexer blocks 1601-1 through 1601-M. The bit width of multiplexer select signals 1611 may be expressed as equal to the value of $[\log_2 N]$. Output multiplexer blocks 1601 respectively have output ports 1615-1 through 1615-M, where each of such ports is B bits wide. In other words, crossbar switch 513 is an N×M×B crossbar switch.

In an embodiment, B may be set to 1 so that any bus width may be supported with the number of multiplexer select signals balanced accordingly. In such an embodiment, there may be more multiplexer select signals than data signals.

Because of large differences between data rates on each wire between HSTs and PLBs instantiated in programmable resources, parallel-side datapath widths of HSTs may for example be 32, 40, 64, 80, 128, or 160. Of course, other datapath widths may be used. Considering error correction coding ("ECC") overhead with single error correction and double error correction detection ("SECDED"), corresponding HST datapath widths are 39, 47, 72, 88, 137, and 169. Thus, to reduce switching congestion, each crossbar switch 513 may run each port approximately twice the speed or more with reference to speed of incoming data, such as may be implemented for double datapath widths. It should be appreciated that crossbar switch 513 may include ECC and/or SECDED, though not shown for purposes of clarity and not limitation.

Figure 17:
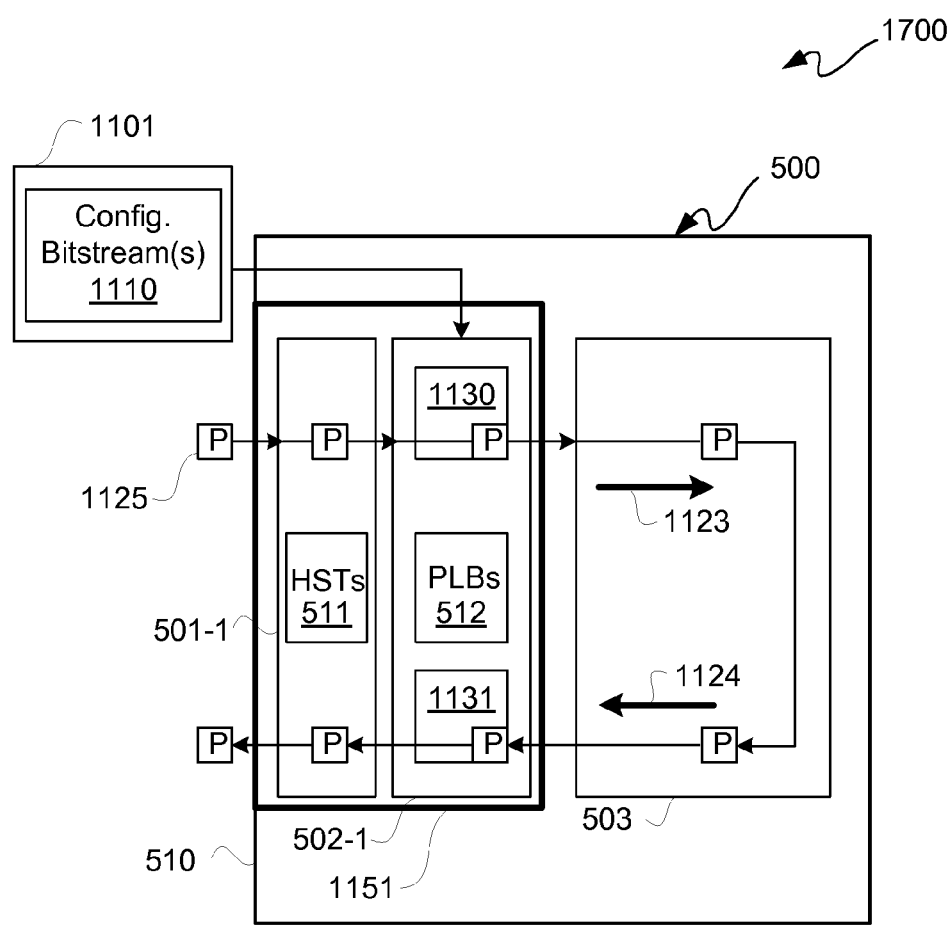
FIG. 17 is a block diagram depicting another exemplary embodiment of a reconfigurable system.

FIG. 17 is a block diagram depicting another exemplary embodiment of a reconfigurable system 1700. Reconfigurable system 1700 is similar to reconfigurable system 1100 of FIG. 11, and thus, only the differences are described for purposes of clarity and not limitation. In this exemplary embodiment of multichip module 500, a single transceiver die 501-1, a single protocol logic blocks die 502-1, and a single crossbar switch die 503 are used. Accordingly, a packet 1125 may be provided from ingress processing block 1130 to a crossbar switch of crossbar switch die 503, and such packet 1125 may be passed back to protocol logic blocks die 502-1 from crossbar switch die 503. More particularly, egress processing block 1131 may be instantiated in protocol logic blocks die 502-1 for receipt of an ingress processed packet 1125 from crossbar switch die 503. It should be understood that both ingress processing block 1130 and egress processing block 1131 may be instantiated in programmable logic blocks die 502-1 responsive to one or more configuration bitstreams 1110.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A multichip module, comprising:
   a first transceiver die having first transceivers;
   a second transceiver die having second transceivers;
   a crossbar switch die having at least one crossbar switch;
   a first protocol logic blocks die having first protocol logic blocks;
   a second protocol logic blocks die having second protocol logic blocks; and
   an interposer to which the first transceiver die, the second transceiver die, the crossbar switch die, the first protocol logic blocks die, and the second protocol logic blocks die are coupled;
   wherein the first and second transceiver dice, the first and second protocol logic blocks dice, and the crossbar switch die are mounted on the interposer; and
   wherein the interposer interconnects the first transceivers and the first protocol logic blocks to one another, interconnects the second transceivers and the second protocol logic blocks to one another, interconnects the first protocol logic blocks and the at least one crossbar switch to one another, and further interconnects the second protocol logic blocks and the at least one crossbar switch to one another.

2. The multichip module according to claim 1, wherein:
   the first transceiver die, the first protocol logic blocks die, the second transceiver die, and the second protocol logic blocks die are all rectangular dice mounted to the interposer with a first orientation;
   the first transceiver die and the first protocol logic blocks die are positioned on a left side of the crossbar switch die;
   the second transceiver die and the second protocol logic blocks die are positioned on a right side of the crossbar switch die;
   the first transceiver die is a leftmost outer die; and
   the second transceiver die is a rightmost outer die.

3. The multichip module according to claim 2, further comprising:
   a third transceiver die having third transceivers; and
   a third protocol logic blocks die having third protocol logic blocks;
   wherein the third transceiver die and the third protocol logic blocks die are coupled to the interposer; and
   wherein the interposer interconnects the third transceivers and the third protocol logic blocks, and further interconnects the third protocol logic blocks and the at least one crossbar switch.

4. The multichip module according to claim 3, further comprising:
   a fourth transceiver die having fourth transceivers; and
   a fourth protocol logic blocks die having fourth protocol logic blocks;
   wherein the fourth transceiver die and the fourth protocol logic blocks die are coupled to the interposer; and
   wherein the interposer interconnects the fourth transceivers and the fourth protocol logic blocks, and further interconnects the fourth protocol logic blocks and the at least one crossbar switch.

5. The multichip module according to claim 4, wherein the first protocol logic blocks die, the second protocol logic blocks die, the third protocol logic blocks die, and the fourth protocol logic blocks die are all field programmable.

6. The multichip module according to claim 5, wherein:
   the third transceiver die, the fourth transceiver die, the third protocol logic blocks die, and the fourth protocol logic blocks die are all rectangular dice mounted to the interposer with a second orientation;
   the second orientation is at least substantially perpendicular to the first orientation;
   the third transceiver die and the third protocol logic blocks die are positioned on a top side of the crossbar switch die;
   the fourth transceiver die and the fourth protocol logic blocks die are positioned on a bottom side of the crossbar switch die;
   the third transceiver die is a topmost outer die; and
   the fourth transceiver die is a bottommost outer die.

7. The multichip module according to claim 6, wherein the first transceiver die, the second transceiver die, the third transceiver die, and the fourth transceiver die are respectively substantially longer than the first protocol logic blocks die, the second protocol logic blocks die, the third protocol logic blocks die, and the fourth protocol logic blocks die.

8. A system including the multichip module of claim 1, wherein:
   the system includes a network switch having a backplane, a line card, and a switch card; and
   the multichip module is mounted on either the line card or the switch card.

9. A method for communication, comprising:
   receiving a packet by a first transceiver die of a multichip module;
   providing the packet from the first transceiver die to a first protocol logic blocks die of the multichip module via an interposer;
   wherein the interposer interconnects the first transceiver die and the first protocol logic blocks die to one another;
   providing the packet from the first protocol logic blocks die to a crossbar switch die of the multichip module via the interposer;
   wherein the interposer interconnects the first protocol logic blocks die and the crossbar switch die to one another;
   providing the packet from the crossbar switch die to a second protocol logic blocks die of the multichip module via the interposer;
   wherein the interposer interconnects the second protocol logic blocks die and the crossbar switch die to one another;
   providing the packet from the second protocol logic blocks die to a second transceiver die of the multichip module via the interposer;
   wherein the interposer interconnects the second protocol logic blocks die and the second transceiver die to one another; and sending the packet from the second transceiver die out of the multichip module.

10. The method according to claim 9, further comprising:
instantiating in the first protocol logic blocks die a first ingress processing block to ingress process the packet according to a first protocol; and
instantiating in the second protocol logic blocks die a first egress processing block to egress process the packet according to the first protocol.

11. The method according to claim 10, further comprising:
instantiating in the first protocol logic blocks die a second ingress processing block to ingress process another packet according to a second protocol; and
instantiating in the second protocol logic blocks die a second egress processing block to egress process the other packet according to the second protocol;
wherein the first protocol and the second protocol are different protocols.

12. The method according to claim 11, wherein:
the first ingress processing block is instantiated in first programmable resources responsive to a first ingress processing block configuration bitstream;
the second ingress processing block is instantiated in second programmable resources responsive to a second ingress processing block configuration bitstream;
the first egress processing block is instantiated in third programmable resources responsive to a first egress processing block configuration bitstream; and
the second egress processing block is instantiated in fourth programmable resources responsive to a second egress processing block configuration bitstream.

13. The method according to claim 9, further comprising:
providing the packet from the crossbar switch die back to the first protocol logic blocks die of the multichip module via the interposer;
providing the packet from the first protocol logic blocks die back to the first transceiver die of the multichip module via the interposer; and
sending the packet from the first transceiver die out of the multichip module.

14. The method according to claim 13, further comprising instantiating, in the first protocol logic blocks die, an ingress processing block to ingress process the packet according to a protocol and an egress processing block to egress process the packet according to the protocol.

15. A multichip module, comprising:
a plurality of communication die;
a plurality of protocol logic blocks die;
a crossbar switch die; and
an interposer on which the at least one communication die, the at least one protocol logic blocks die, and the crossbar switch die are mounted;
wherein the interposer interconnects the at least one communication die, the at least one protocol logic blocks die, and the crossbar switch die for communication of information into and out of the multichip module via at least one of each of three types of die represented by the at least one communication die, the at least one protocol logic blocks die, and the crossbar switch die.

16. The multichip module according to claim 15, wherein:
a first number of the plurality of communication die and the plurality of protocol logic blocks die are mounted on the interposer with a first orientation;
a second number of the plurality of communication die and the plurality of protocol logic blocks die are mounted on the interposer with a second orientation; and
the first orientation is perpendicular or substantially perpendicular to the second orientation.

17. The multichip module according to claim 15, wherein:
the plurality of communication die is fabricated using a first semiconductor process; and
the plurality of protocol logic blocks die is fabricated using a second semiconductor process more advanced than the first semiconductor process.

18. The multichip module according to claim 17, wherein the crossbar switch die is fabricated using the second semiconductor process.

* * * * *